United States Patent [19]

Altoz et al.

[11] Patent Number: 4,463,409

[45] Date of Patent: Jul. 31, 1984

[54] ATTITUDE INDEPENDENT EVAPORATIVE COOLING SYSTEM

[75] Inventors: Frank E. Altoz, Catonsville; John J. Chino, Arnold, both of Md.

[73] Assignee: Westinghouse Electric Corp., Pittsburgh, Pa.

[21] Appl. No.: 478,124

[22] Filed: Mar. 22, 1983

[51] Int. Cl.³ .............................................. H05K 7/20
[52] U.S. Cl. ................................................... 361/382
[58] Field of Search ............... 361/274, 379, 381, 382, 361/385

[56] References Cited

U.S. PATENT DOCUMENTS

| | | | |
|---|---|---|---|
| 3,138,652 | 6/1964 | Ford et al. | 361/274 X |
| 3,365,620 | 1/1968 | Butler et al. | 361/382 |
| 3,370,203 | 2/1968 | Kravitz et al. | 361/381 X |
| 4,027,728 | 6/1977 | Kobayashi et al. | 361/385 X |
| 4,093,971 | 6/1978 | Chu et al. | 361/382 |
| 4,245,273 | 1/1981 | Feinberg et al. | 361/382 |
| 4,283,754 | 8/1981 | Parks | 361/382 |
| 4,330,033 | 5/1982 | Okada et al. | 361/385 X |
| 4,331,830 | 5/1982 | Conway et al. | 361/385 X |

Primary Examiner—Donald A. Griffin
Attorney, Agent, or Firm—W. G. Sutcliff

[57] ABSTRACT

An attitude independent, evaporative cooling system used in airborne systems for cooling electronic components. The coolant is water contained within ducts in heat transfer relationship with the electronic components. The ducts are sealed to water passage by porous membranes which permit passage of steam into a manifold which is sealed by a normally closed pressure relief valve. The relief valve is operable at a selected steam pressure which corresponds to the desired maximum operating temperature for the electronic components.

10 Claims, 4 Drawing Figures

ATTITUDE INDEPENDENT EVAPORATIVE COOLING SYSTEM

GOVERNMENT CONTRACT

The invention herein described was made in the course of or under a contract or subcontract with the Department of the Air Force.

BACKGROUND OF THE INVENTION

The present invention relates to cooling systems for electronic components. More particularly, the invention is directed to cooling systems utilized in airborne or space environments where the vehicle is subject to high acceleration forces and rapid changes in attitude. The cooling systems of the present invention are also designed for use with electronic components which have high transient heat loads such as in airborne radar systems. Evaporative cooling systems for electronic components are known in the art, but in general these require a specific vehicle orientation for efficient operation.

Efficient cooling systems are a requirement for the electronic components associated with airborne radar systems. Such radar systems may be associated with a manned aircraft, a remotely controlled surveillance vehicle, and even more recently with a weapon system such as a missile with high maneuverability to track a target. The radar system includes an antenna which is coupled to such electronic components, and the operation of the radar is dependent upon effective cooling of these components during the flight mission. The radar antenna is typically incorporated into the aircraft or vehicle surface and can be subject to high thermal heat loads. The antenna is coupled to the electronic components which generate the radar beam which is radiated from the antenna. Significant heat is generated by these electronic components during radar operation, and this heat must be efficiently dissipated to prevent electrical degradation. For such radar systems which are operable in highly maneuverable vehicles, in very high altitude, or space environments, the cooling system must efficiently operate in all possible vehicle orientations as well as under high G forces.

SUMMARY OF THE INVENTION

An attitude independent evaporative cooling system is detailed for maintaining electronic components of an airborne radar system below a predetermined maximum operating temperature. The cooling system is thermally coupled to the electronic components and dissipates the heat generated within the operating electronic components to maintain their normal electrical performance characteristics. The evaporative cooling system includes means containing water coolant in intimate heat transfer relationship with the electronic components. This water coolant containing means is sealed to the passage of water by a porous hydrophobic membrane which permits steam to pass through the membrane. A sealed steam manifold is coupled to the water coolant containing means by this porous hydrophobic membrane. A normally closed pressure relief means is included in the manifold whereby steam formed by evaporative heating of the water passes through the porous membrane to the steam manifold, and the pressure relief means is operable at a predetermined pressure value corresponding to the predetermined maximum operating temperature permitting release of steam from the manifold, and lowering of the steam pressure in the manifold.

DESCRIPTION OF THE PREFERRED EMBODIMENTS

Figure 1:
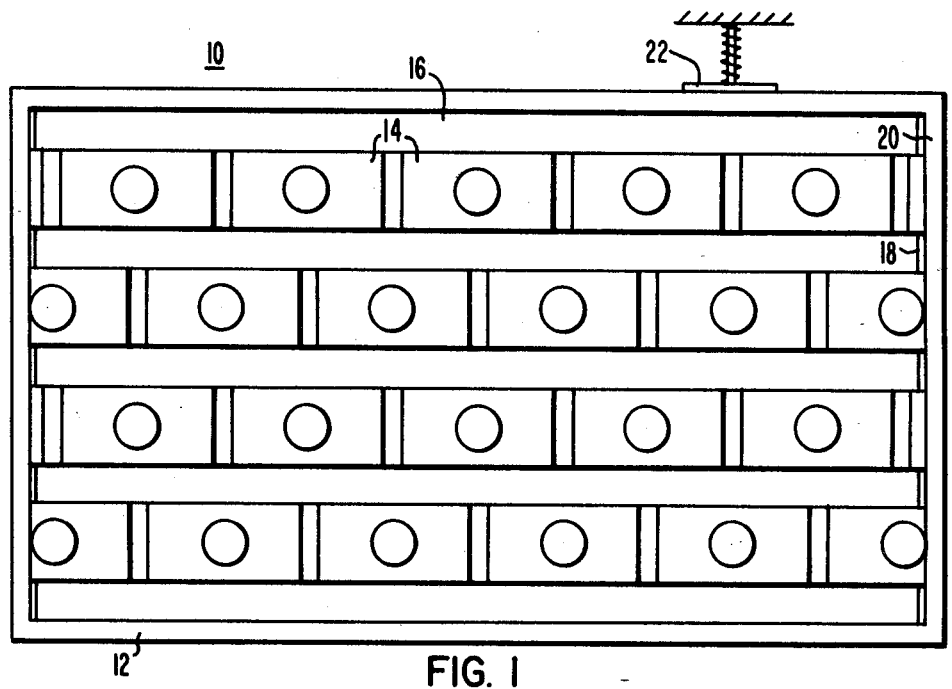
FIG. 1 is a schematic illustration of an evaporative cooling system of the present invention.
Figure 2:
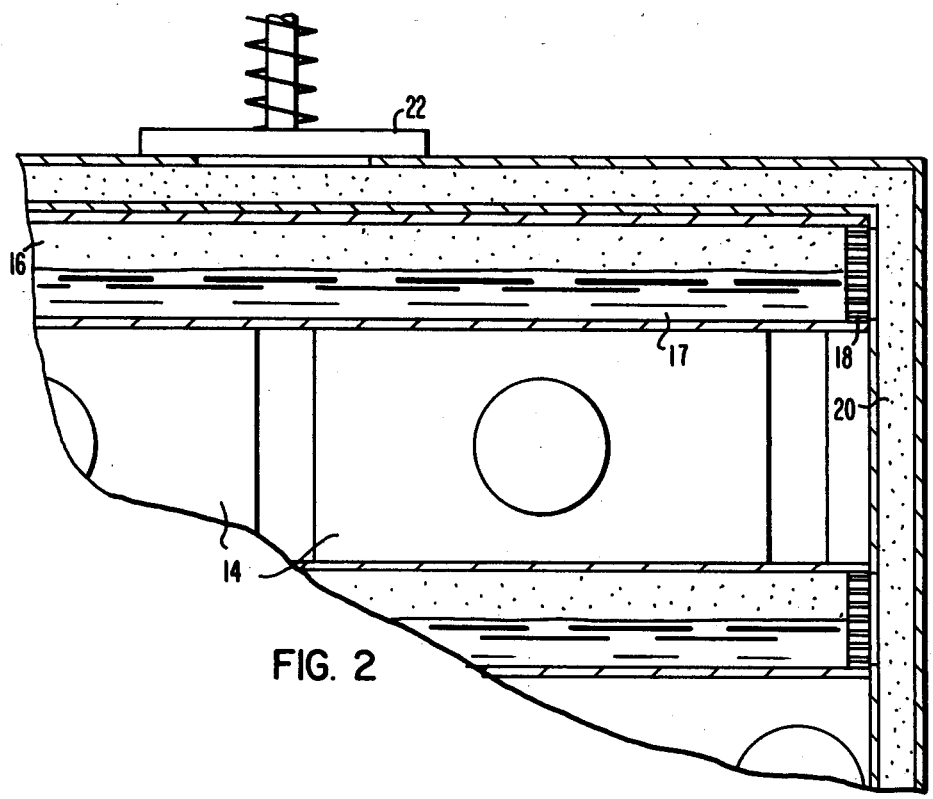
FIG. 2 is an enlarged view of the upper right portion of FIG. 1, with partial sectional view to facilitate description of the evaporative cooling system seen in FIG. 1.

The present invention can be best undersood by reference to the schematic illustrations set forth in FIGS. 1 and 2. The evaporative cooling system 10 comprises a rectangular mounting or baseplate 12 upon which is mounted a plurality of radar beam generating phaser modules 14, which are symmetrically arrayed in a plurality of rows which are spaced apart on the surface of the baseplate 12. In this schematic illustration, four rows of phaser modules 14 are shown by way of example. The phaser modules 14 are the active radiating elements of a phase array synthetic aperture radar system. Such phased array synthetic aperture radar systems are well known in the art, and utilize signal processing techniques to generate an electronically scanned radar beam. A plurality of water coolant containing ducts or channels 16 are provided disposed on opposed sides of each row of phaser module electronic components. These water ducts 16 can be formed as channels in the baseplate 12, which ducts can then be sealed with the water enclosed therein by a cover plate or can comprise closed ducts which are mounted on the baseplate 12 between the rows of phaser modules. The water coolant containing ducts 16 are in intimate heat transfer relationship with the electronic component phaser modules. The ducts 16 are sealed at each end to the passage of the water 17, which is shown in the topmost water duct, by a porous hydrophobic membrane 18. A peripheral manifold 20 is provided about the perimeter of the baseplate 12 and is coupled to opposed ends of each of the water filled ducts 16 via the porous membranes 18 which serve as seals between the ducts 16 and the manifold 20. The porous hydrophobic membranes 18 do not permit passage of water from the ducts 16 to the manifold 20, but do permit passage of steam which is generated within ducts 16 due to heat dissipation therein from the electronic components. As seen in the schematic in FIG. 2, the water level in duct 16 does not fill the duct, and steam is evolved in the duct due to evaporative heating of the water within the duct. The porous hydrophobic membrane materials have a small pore size, of typically about 0.2 microns, and are known in the art, by way of example the membrane 18 can comprise fluoropore filter material type No. FGLP09025 which is available from the Millipore Corporation of Bedford, Mass.

A normally closed pressure relief means 22 seals the manifold 20 and has a design opening pressure relief value at a desired steam pressure in pounds per square inch in absolute value which corresponds to the water temperature at the predetermined maximum operating temperature which is desired for the electronic components.

The quantity of water coolant as well as the shape and size of the water coolant containing ducts depends on the specific application and system which is to be cooled. The predetermined desired maximum operating temperature for the system and for the electronic components is, for example, controlled to about 60° C. by virtue of the pressure relief valve 22, which is spring loaded to open at a steam pressure of 2.7 psia. In a high altitude or space environment, a 2.7 psia value corresponds to a saturation temperature for steam of about 58.5° C. Thus steam which is generated within the water coolant containing duct 16, passes through the porous membrane 18, and collects in the normally sealed steam manifold until the predetermined desired operation of the pressure relief valve relieves this pressure. In this evaporative cooling system, since the water coolant is stored in sealed ducts, the system can be stored, transported and operated in any attitude, and can be subject to extremely high acceleration forces without the water being lost. The porous membrane which is a Teflon-like material of a small pore diameter size will not permit passage of fluid water even under extreme pressure differentials of about a thousand psi. The porous membrane does however permit easy passage of steam through the membrane.

For testing and operation of the radar system on the ground, auxiliary coolant means is provided on the back surface of the mounting plate. This cooling means permits continuous passage of liquid coolant during operation of the antenna on the launch pad or in a ground test environment. Heat generated within the electronic components is transferred via conduction through the mounting plate into the continuously circulating water coolant. This preserves the stored water coolant sealed in the water ducts of the evaporative cooling system so that it is only used during flight with the radar in operation. The auxiliary cooling means permits operation of the radar in the lab or in qualification testing with the continuously circulated coolant in the auxiliary coolant means passing through at temperatures much lower than the saturation temperature of the water in the sealed coolant duct.

As illustrated in FIG. 1 the coolant water does not totally fill the water duct 16, and an appropriate volume expansion is designed into the system to allow the water to freeze and expand in the duct. In addition the water coolant typically has added to it conventional corrosion inhibitors as are well known in the art.

Figure 3:
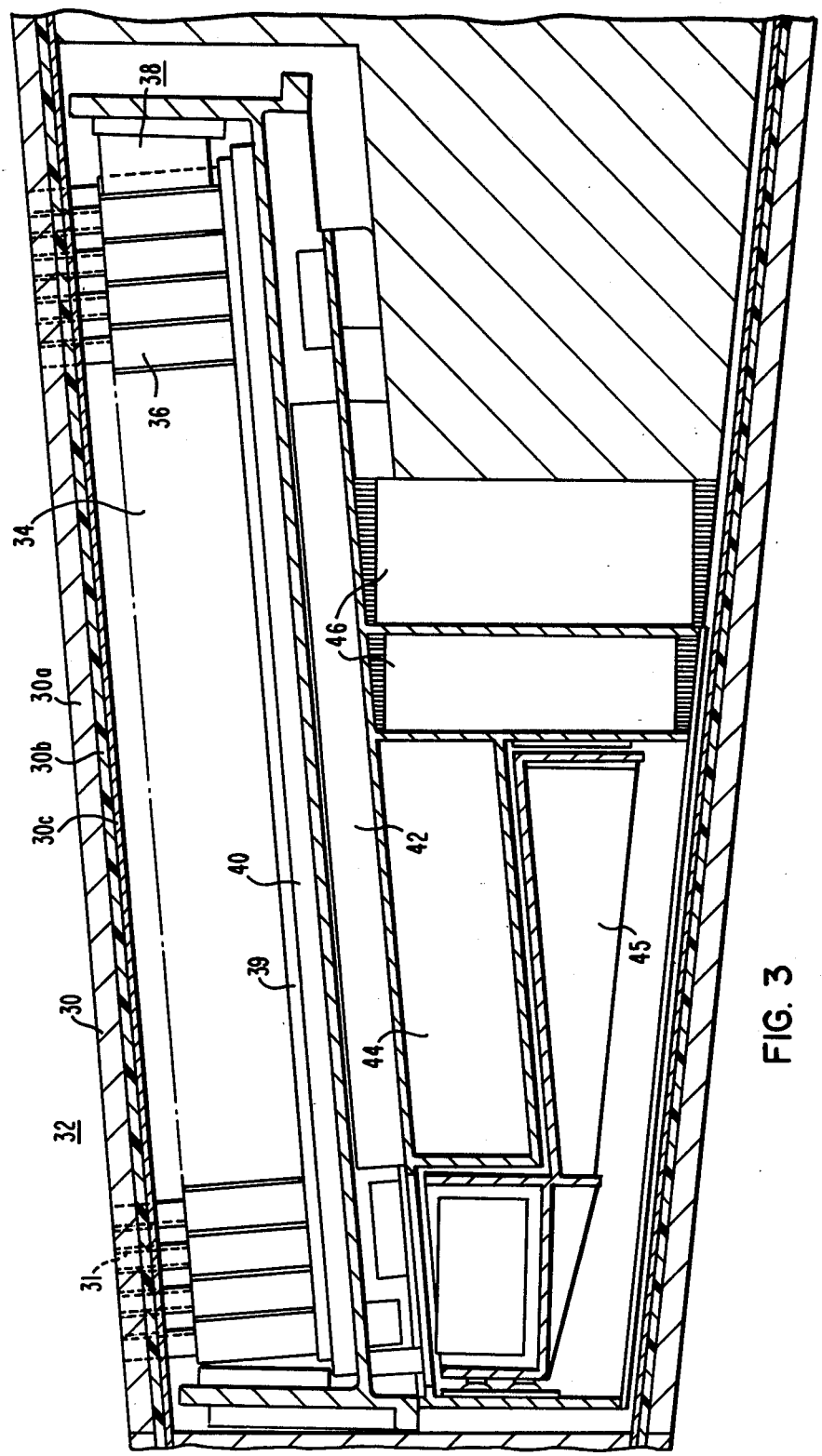
FIG. 3 is a partial elevational view of an airborne radar system with the antenna array and cooling system of the present invention closely spaced from the airframe within which the radar system is disposed.
Figure 4:
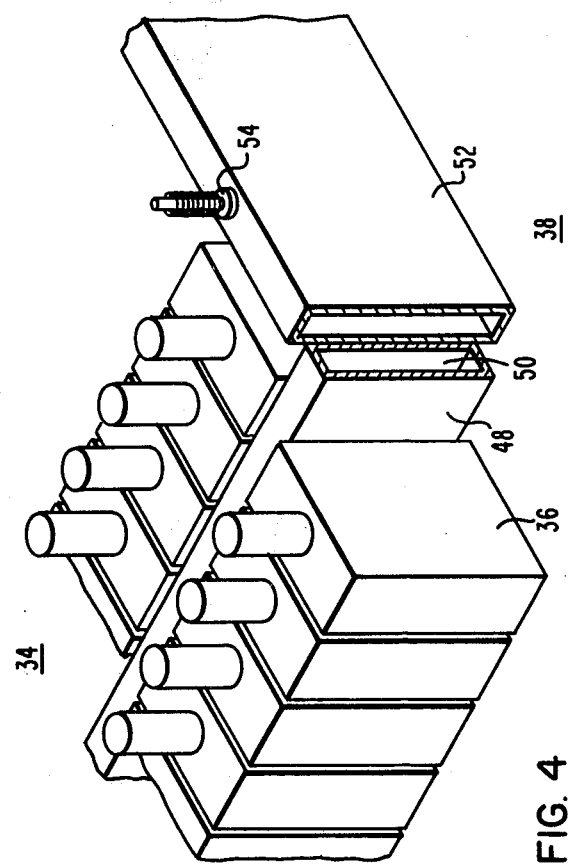
FIG. 4 is an enlarged perspective view of a portion of the antenna array seen in FIG. 3 to better illustrate the evaporative cooling system which is coupled to transmit-receive modules of the radar system.

In the embodiment of the invention seen in FIGS. 3 and 4 an evaporative cooling system as discussed above with respect to FIGS. 1 and 2 is provided as part of a radar system which is incorporated into an air frame or missile. The air frame or missile body 30 is here seen as a conically tapered plural layered member with only a fragmentary portion of the total aircraft or missile body being illustrated. The radar system 32 includes an antenna portion 34 which comprises an array of rows of transmit-receive modules 36 which are closely spaced from the interior surface of the airframe or missile body 30. The airframe or missile body 30 may comprise a plurality of layers of material, such as an outer metal layer 30a and heat resistant inner layers 30b, 30c. A plurality of apertures 31 may be provided through the body 30 aligned with the radiating elements of the antenna array. These apertures are filled with radiation transmissive material, such as ceramic. The evaporative cooling system 38 is coupled to the transmit-receive modules 36 as will be described more clearly with respect to FIG. 4. The transmit-receive modules 36 of the phased array antenna 34 are coupled by a microwave circuit connection means 39 to a microwave manifold 40 which feeds power to the modules 36. Radar receiver means 42 is coupled to the antenna 34 and to signal processing and control means 44 which includes means for generating the desired radar output signal and for interpreting the received radar echo signals. A stabilized local oscillator means 45 is also operably connected to the antenna. A battery power supply means 46 provides electrical energy for the radar system. Such a self-contained battery power source would be required for a radar system mounted in a missile, while electrical power could be had from the main aircraft electrical generating system in an aircraft mounted system.

FIG. 4 best illustrates the interconnection of the evaporative cooling means 38 and the transmit-receive modules 36. The transmit-receive modules 36 are arrayed in a plurality of rows which are formed between spaced parallel plate heat transfer means 48. The spaced parallel plate heat transfer means 48 are channeled with the channel 50 extending along the extent of the heat transfer member 48. The channel 50 is sealed at each end with a porous membrane which couples the channels 50 to steam manifold members 52 disposed at each end of the parallel plate heat transfer members 48. The normally closed pressure relief means 54 is provided in the wall of the sealed steam manifold 52. Water coolant is provided within the sealed channels 50, and as explained with respect to the embodiment of FIGS. 1 and 2. Heat generated in the transmitter-receiver modules 36 is dissipated by evaporation of water in the channels 50 of the heat transfer members 48, with steam passing through the porous membranes between the channels 50 and steam manifold 52. The pressure relief means has a preset spring control which operates at a predetermined steam pressure value which corresponds to a water temperature at the predetermined maximum operating temperature desired for the transmitter receiver modules.

We claim:
1. An attitude independent evaporative cooling system for maintaining electronic components of an airborne radar system, to which the cooling system is thermally coupled, below a predetermined maximum operating temperature comprising;
   (a) means containing water coolant in intimate heat transfer relationship with the electronic components, which means is sealed to passage of water by a porous membrane which permits steam to pass through the membrane;
   (b) a solid steam manifold coupled to the water containing means by the porous membrane;
   (c) a normally closed pressure relief means included in the manifold whereby steam formed by evaporative heating of the water passes through the porous membrane to the steam manifold, and opens the pressure relief means at a predetermined pressure value corresponding to a water temperature at the predetermined maximum operating temperature permitting release of steam from the manifold and lowering the steam pressure in the manifold.

2. The attitude independent evaporative cooling system set forth in claim 1, wherein the water containing means includes a thermally conductive heat transfer member in intimate heat transfer contact with the electronic components.

3. The attitude independent evaporative cooling system set forth in claim 1, wherein the electronic components comprise an array of transmit-receive modules of a phased array radar system.

4. The cooling system set forth in claim 1, wherein the normally closed pressure relief means is spring loaded to open when the steam pressure in the manifold corresponds to a predetermined saturation temperature for water which defines the desired maximum operating temperature for the electronic components.

5. The cooling system set forth in claim 1, wherein the system is adapted for use in a space environment with the quantity of water selected to determine a desired operating time at the predetermined maximum operating temperature.

6. The cooling system set forth in claim 1, wherein the water containing means comprises a plurality of symmetrically spaced ducts which are connected to a peripheral manifold.

7. The cooling system set forth in claim 1, wherein the porous membrane is a hydrophobic medium.

8. The cooling system set forth in claim 7, wherein the porous membrane has a pore size of approximately 0.2 microns.

9. The cooling system set forth in claim 1, wherein the volume of the means for containing the water includes sufficient volume to accommodate the expanded volume of ice formed by freezing of the water coolant.

10. The cooling system set forth in claim 1, wherein selected corrosion inhibitors are added to the water.

* * * * *